(12) United States Patent
Vedula

(10) Patent No.: US 7,340,371 B2
(45) Date of Patent: Mar. 4, 2008

(54) SYSTEM, METHOD, AND COMPUTER PROGRAM PRODUCT FOR PERFORMING TRANSFORMATION OF ROTATIONS TO TRANSLATIONS DURING FINITE ELEMENT STIFFNESS FORMULATION

(75) Inventor: Phanindranath Vedula, Macomb, MI (US)

(73) Assignee: Siemens Product Lifecycle Management Software Inc.

( * ) Notice: Subject to any disclaimer, the term of this patent is extended or adjusted under 35 U.S.C. 154(b) by 527 days.

(21) Appl. No.: 10/916,375

(22) Filed: Aug. 11, 2004

(65) Prior Publication Data

US 2006/0034546 A1  Feb. 16, 2006

(51) Int. Cl.
*G01B 7/00* (2006.01)
(52) U.S. Cl. ................................................ 702/155
(58) Field of Classification Search ................. 702/155
See application file for complete search history.

(56) References Cited

U.S. PATENT DOCUMENTS

| | | | | |
|---|---|---|---|---|
| 5,594,651 A | * | 1/1997 | St. Ville | 700/98 |
| 5,796,617 A | * | 8/1998 | St. Ville | 700/98 |
| 6,101,450 A | * | 8/2000 | Dasgupta | 702/42 |
| 6,263,252 B1 | * | 7/2001 | St. Ville | 700/98 |
| 6,718,291 B1 | * | 4/2004 | Shapiro et al. | 703/2 |
| 6,876,956 B1 | * | 4/2005 | Cirak et al. | 703/2 |
| 6,901,809 B2 | * | 6/2005 | Dong et al. | 73/789 |
| 2004/0111242 A1 | | 6/2004 | Vedula | |
| 2004/0194051 A1 | * | 9/2004 | Croft | 716/20 |

OTHER PUBLICATIONS

A.G. Razaqpur et al., "An Improved Quadrilateral Finite Element for Analysis of Thin Plates", Finite Elements in Analysis and Design, vol. 40, No. 1, Nov. 2003, pp. 1-23.

D.J. Allman, "A Compatible Triangular Element Including Vertex Rotations for Plane Elasticity Analysis", Computers & Structures, vol. 19, No. 1-2, 1984, pp. 1-8.

* cited by examiner

*Primary Examiner*—John Barlow
*Assistant Examiner*—Aditya S. Bhat

(57) ABSTRACT

A system, method, and computer program product for transformation of rotations to translation degrees of freedom in structural analysis during finite element formulation.

21 Claims, 4 Drawing Sheets

SYSTEM, METHOD, AND COMPUTER PROGRAM PRODUCT FOR PERFORMING TRANSFORMATION OF ROTATIONS TO TRANSLATIONS DURING FINITE ELEMENT STIFFNESS FORMULATION

TECHNICAL FIELD OF THE INVENTION

The present invention is directed, in general, to finite element analysis and processing.

BACKGROUND OF THE INVENTION

One important concept in geometry is that of a transformation. This is mapping of every point in the plane to a corresponding point in the new plane. There are several different types of transformations that can be considered, including congruent, which is shape and size preserving (e.g. translation), similarity, which is shape preserving (e.g. scaling), and affine, which is collinearity preserving (i.e. preserves parallelism, e.g. rotation). A rotational transformation is affine and congruent.

In finite element analysis, the structural behavior of any body or a region is analyzed by first discretizing the region/domain of interest into several finite elements that are interconnected at nodes. Depending on the type of analysis and accuracy desired, several types of finite elements such as beam, shell and solid elements or a combination of these elements are used for discretizing the domain.

The next step is evaluating the displacements at each node for all finite elements in the region of interest by employing force displacement and equilibrium relations. The nodal displacements are evaluated in terms of translation and rotation components and are often referred as independent degrees of freedom (d.o.f). The nodal displacement for any finite element in a three dimensional space can be expressed as 3 translation components (u, v, w) and 3 rotation components ($\theta x$, $\theta y$, $\theta z$).

Finally, the stresses and strains for each element are evaluated from these nodal translations and rotations using strain displacement and stress strain relations.

Currently in all the available finite element procedures and packages, the following problems exist for structural analysis:

One problem is that beam and shell elements consider both translation and rotation degrees of freedom (DOF), where as solid elements consider only translation DOF. Due to this, DOF mismatch occurs at the shell—solid and beam—solid interfaces which in turn result in wrong results and often singularities during solution.

Another problem is that basic rotational loads like torque and moment are directly related to the rotational DOF and hence solid elements do not consider these basic loads.

Another problem is that translation and rotation DOF at each node are treated as independent of each other which is very difficult to comprehend since from fundamental strain—displacement relations, rotations are dependent on translations and vice versa.

Another problem is that consideration of translation and rotation DOF as independent is even more counterintuitive for cylindrical coordinate (r, $\theta$, z) and spherical coordinate (r, $\theta$, $\phi$) systems. This is because $\theta$ direction in cylindrical system, and $\theta$ and $\phi$ directions in spherical system, represent the rotations themselves. Hence, consideration of rotations about these rotational axes is very confusing.

Current approaches to rotational transformations include the use of solid elements with 6 DOF containing both translation and rotation DOF. However, these elements consume lot of computational resources. Due to this, not all existing analysis systems can support this feature.

Another approach includes the use of multi-point constraints and rigid link elements and special interface elements to tie the shell rotations to solid translations. This is a manual and cumbersome procedure and is extremely difficult to implement in large complex models. Further, the user needs to make several assumptions depending on the application.

All these existing methods find limited use and are employed only to eliminate singularities during solution. Moreover, they still produce inaccurate results at the shell-solid and beam solid interface regions.

There is a need in the art for a system, process, and computer program product for performing improved rotational transformations.

SUMMARY OF THE INVENTION

The preferred embodiment provides a system, method, and computer program product for transformation of rotations to translation degrees of freedom in structural analysis during finite element formulation.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 4, discussed herein, and the various embodiments used to describe the principles of the present invention in this patent document are by way of illustration only and should not be construed in any way to limit the scope of the invention. Those skilled in the art will understand that the principles of the present invention may be implemented in any suitably arranged device. The numerous innovative teachings of the present application will be described with particular reference to the presently preferred embodiment.

The preferred embodiment provides a system, method, and computer program product for transformation of rotations to translation degrees of freedom in structural analysis during finite element formulation.

Figure 1:
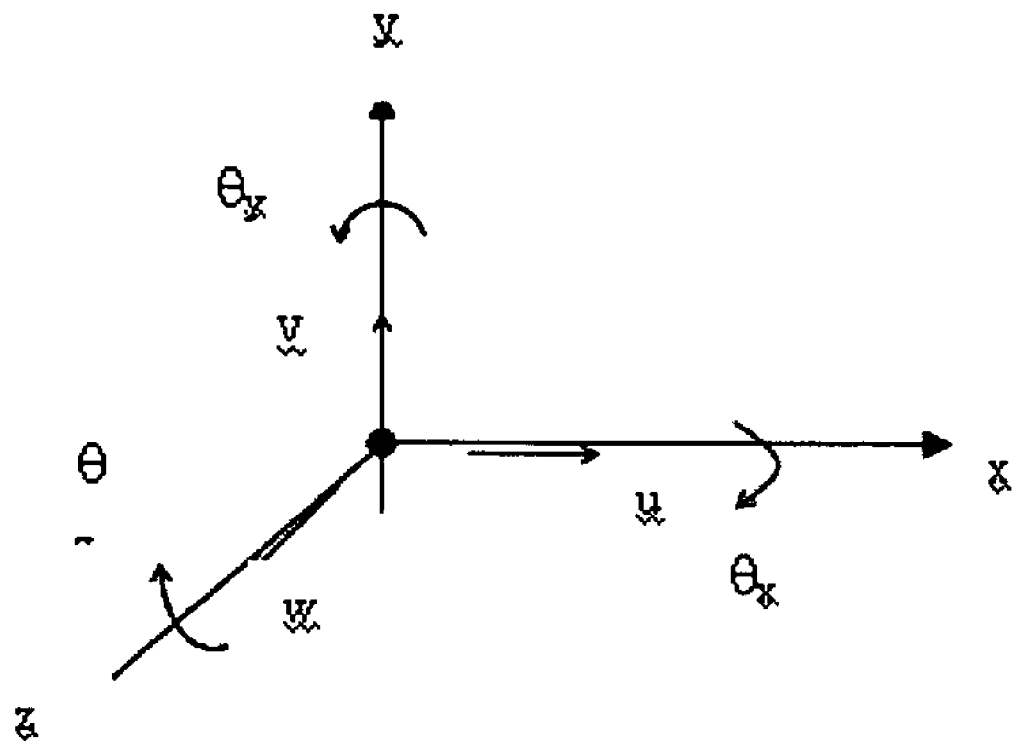
FIG. 1 depicts the displace components of a node in 3d rectangular coordinate system, in accordance with an embodiment of the present invention.

FIG. 1 depicts the displace components of a node in 3d rectangular coordinate system. The nodal displacement for any finite element in a three dimensional space can be expressed as 3 translation components (u, v, w) and 3 rotation components (θx, θy, θz) as shown in FIG. 1.

According to a preferred embodiment, a new finite element formulation for beam, shell and solid elements is used for structural analysis. This formulation treats rotation DOF as dependent on the translation DOF, thereby eliminating many of the limitations described above.

According to a preferred embodiment, a novel element stiffness formulation for beam, shell and solid elements is used to analyze the structural behavior of any region of interest. During the element stiffness matrix formulation, rotational components of the nodes are expressed as functions of translation DOF by employing strain displacement and equilibrium relations. Due to this, the nodes of any finite element contain only 3 independent translation degrees of freedom.

According to the disclosed process, when an object model is to be rotated, the system will first divide the region of interest into small finite elements (such as beam, shell and solid elements) with nodes, as in any conventional finite element procedure.

Next, the system will use an approximate displacement solution for each finite element depending on the element type, as described below.

Next, the system will formulate element stiffness matrices for each type of element by expressing the rotational DOF as functions of translation DOF and using strain-displacement relations. During the element stiffness formulation, effects of all types of axial, traverse, moment and torque loads are considered. Next, the system will formulate the global stiffness matrix from the individual element stiffness matrices and transform the governing equations into set of algebraic equations.

The system will then substitute the loads and boundary conditions, then evaluate the nodal displacements in terms of translation DOF.

Next, the system will evaluate the rotational displacements from the translations, and then evaluate the element strains and stresses using strain-displacement and stress-strain relations.

Figure 2:
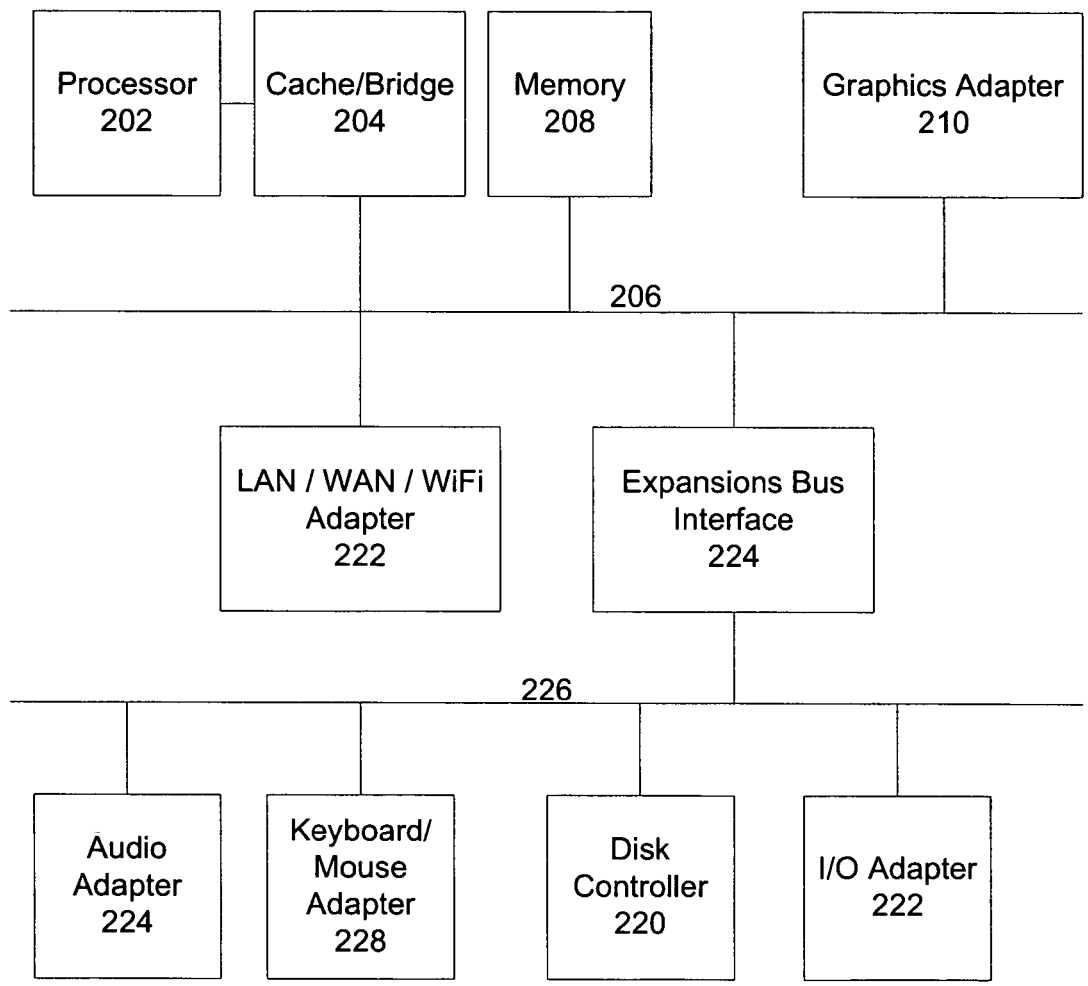
FIG. 2 depicts a block diagram of a data processing system in which a embodiment of the present invention can be implemented.

FIG. 2 depicts a block diagram of a data processing system in which a preferred embodiment can be implemented. The data processing system depicted includes a processor 102 connected to a level two cache/bridge 204, which is connected in turn to a local system bus 206. Local system bus 206 may be, for example, a peripheral component interconnect (PCI) architecture bus. Also connected to local system bus in the depicted example are a main memory 208 and a graphics adapter 210.

Other peripherals, such as local area network (LAN)/Wide Area Network/Wireless (e.g. WiFi) adapter 212, may also be connected to local system bus 206. Expansion bus interface 214 connects local system bus 206 to input/output (I/O) bus 216. I/O bus 216 is connected to keyboard/mouse adapter 218, disk controller 220, and I/O adapter 222.

Also connected to I/O bus 216 in the example shown is audio adapter 224, to which speakers (not shown) may be connected for playing sounds. Keyboard/mouse adapter 218 provides a connection for a pointing device (not shown), such as a mouse, trackball, trackpointer, etc.

Those of ordinary skill in the art will appreciate that the hardware depicted in FIG. 2 may vary for particular. For example, other peripheral devices, such as an optical disk drive and the like, also may be used in addition or in place of the hardware depicted. The depicted example is provided for the purpose of explanation only and is not meant to imply architectural limitations with respect to the present invention.

A data processing system in accordance with a preferred embodiment of the present invention includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present invention as described.

Figure 3:
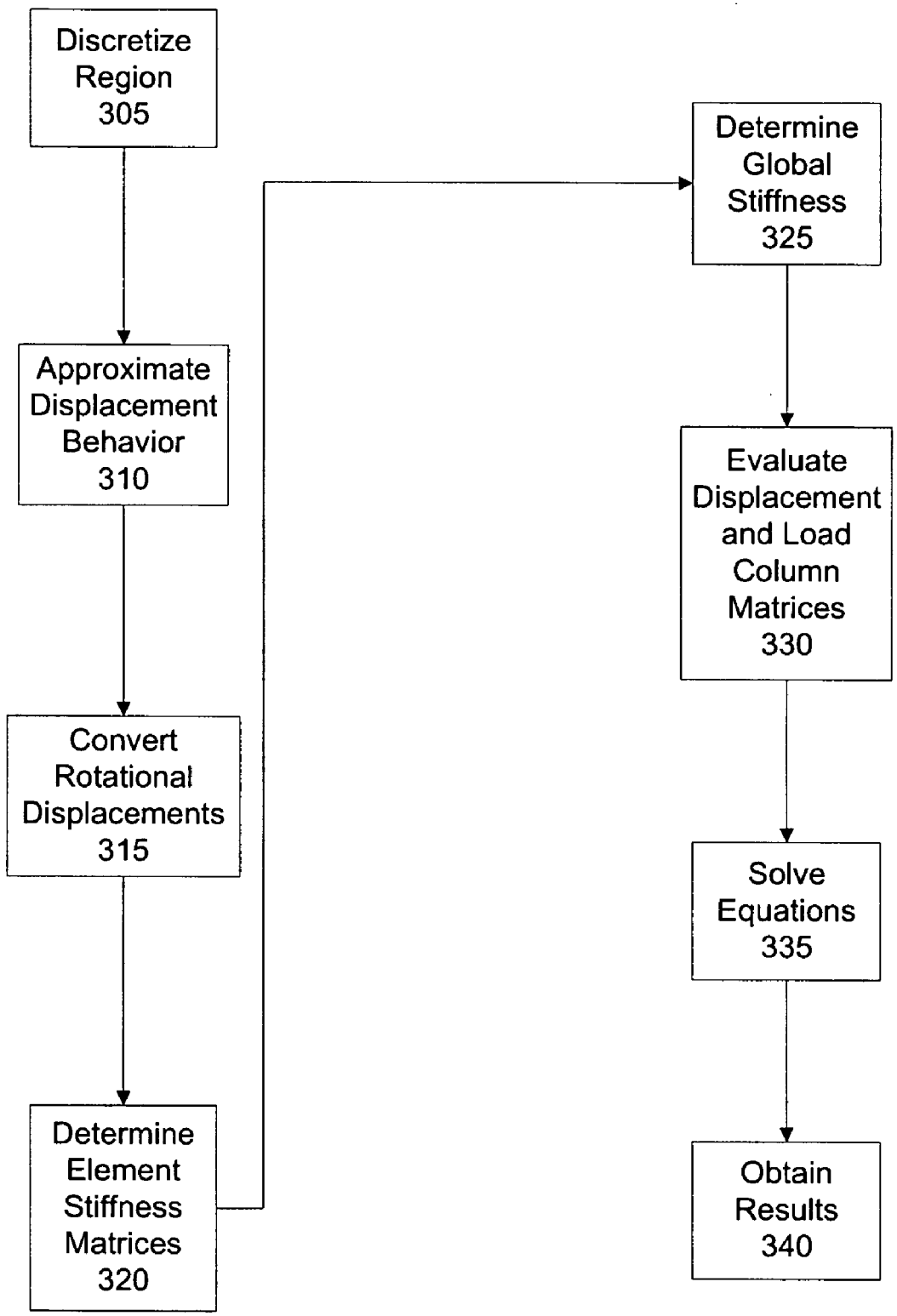
FIG. 3 depicts a flowchart of a process in accordance with an embodiment of the present invention.

FIG. 3 shows a flowchart of a process in accordance with a preferred embodiment. The system first discretizes or divides the region of interest into beam/shell/solid elements (step 305)

Next, the system approximates the displacement behavior of each element in terms of spatial coordinates (step 310).

Next, the system converts the rotational displacements to translations based on force displacement relations (step 315).

The system then determines an element stiffness matrix for each element considering the effect of both translation and rotation loads (step 320).

The system then determines global stiffness, by assembling all the element stiffness matrices (step 325).

Next, the system evaluates displacement and load column matrices by substituting loads and boundary conditions (step 325).

The system then solves the resulting system of algebraic equations using standard direct or iterative solvers like Sparse, preconditioned conjugate methods and obtains translation displacements at each node (step 330).

Finally the system obtains results like element strains and stresses from strain-displacement and stress-strain relations.

The disclosed process eliminates several disadvantages of currently available finite element methods for structural analysis. For example, solid elements can consider rotational loads such as moments and torques. Also, as all the beam, shell and solid elements contain same DOF there is no DOF mismatch. Due to this singularities in solution are avoided and relatively accurate results are obtained Further, since the rotation DOF are eliminated, as they are expressed as dependent DOF on the translation DOF, the total number of DOF in analysis is lower and hence computational time for solution is considerably reduced.

In a preferred embodiment, the stiffness formulation of following elements is as described below and illustrated in FIGS. 4A-4E. In these figures, each node is numbered, and these node numbers are used as subscripts for the discussion below. The displace components at each node in these figures is as illustrated in FIG. 1, as 3 translation components (u, v, w) and 3 rotation components ($\theta x$, $\theta y$, $\theta z$).

Figure 4A:
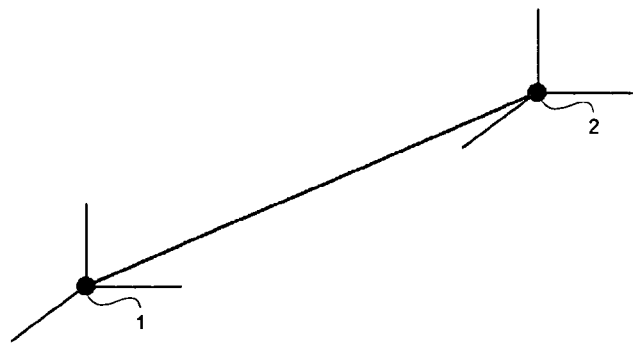
FIGS. 4A-4E depict exemplary elements in accordance with an embodiment of the present invention.
Figure 4B:
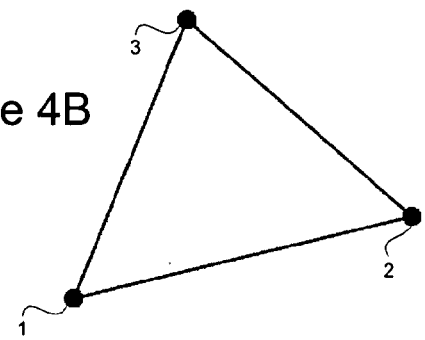
Figure 4C:
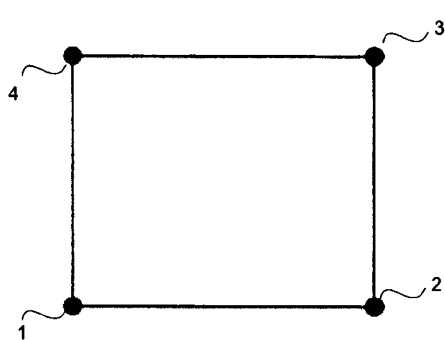

A beam element, that is, a two-noded line element, is illustrated in FIG. 4A. Exemplary shell elements are illustrated as a three-noded triangle in FIG. 4B and as a four-noded quadrilateral in FIG. 4C.

Figure 4D:
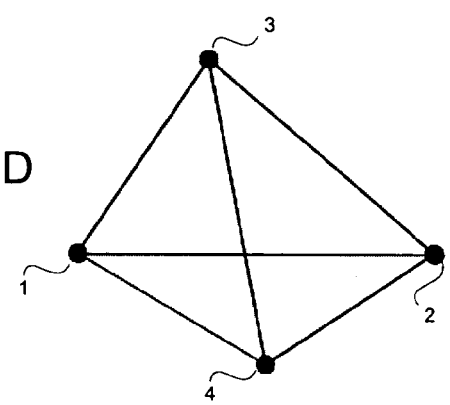
Figure 4E:
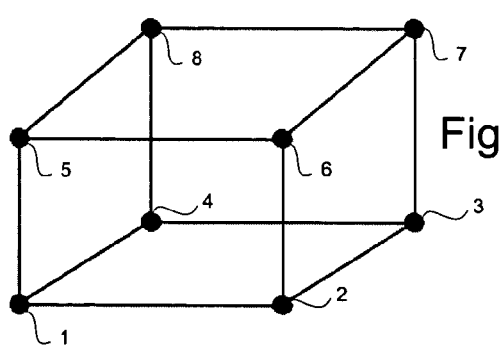

Exemplary solid elements are illustrated as a tetrahedron in FIG. 4D and a cube element in FIG. 4E.

The force displacement relations are:

$$[K_{ij}]\{U_i\}=\{F_i\}$$

Where i represents the node number;

K is the element global stiffness matrix

U is the displacement vector;

F is the force vector; and

U vector at a node i can be represented as:

$$\{U_i\} = \begin{Bmatrix} u_i \\ v_i \\ w_i \\ \theta_{xi} \\ \theta_{yi} \\ \theta_{zi} \end{Bmatrix}$$

where u, v, w represent translations and $\theta_x$, $\theta_y$, $\theta_z$ represent translation and rotation d.o.f about x, y and z axes.

Similarly, F vector at node i can be represented as $$\{F_i\} = \begin{Bmatrix} F_{xi} \\ F_{yi} \\ F_{zi} \\ M_{xi} \\ M_{yi} \\ M_{zi} \end{Bmatrix}$$

where $F_x$, $F_y$, $F_z$ represent forces and $M_x$, $M_y$, $M_z$ represent moments along x, y and z axes.

Consider a beam element:

The force-displacement relationship can be expressed as:

$$\begin{bmatrix} K_{11} & K_{12} & \ldots & K_{112} \\ K_{21} & K_{22} & \ldots & K_{212} \\ \ldots & \ldots & \ldots & \ldots \\ \ldots & \ldots & \ldots & \ldots \\ K_{121} & \ldots & \ldots & K_{1212} \end{bmatrix} \begin{Bmatrix} u_1 \\ v_1 \\ w_1 \\ \theta_{x1} \\ \theta_{y1} \\ \theta_{z1} \\ u_2 \\ v_2 \\ w_2 \\ \theta_{x2} \\ \theta_{y2} \\ \theta_{z2} \end{Bmatrix} = \begin{Bmatrix} F_{x1} \\ F_{y1} \\ F_{z1} \\ M_{x1} \\ M_{y1} \\ M_{z1} \\ F_{x2} \\ F_{y2} \\ F_{z2} \\ M_{x2} \\ M_{y2} \\ M_{z2} \end{Bmatrix}$$

All existing element stiffness formulations treat rotational dof ($\theta$) as independent of translations. However from strain displacement relations, it is known that $$\theta_x = \partial u/\partial y + \partial u/\partial z$$

$$\theta_y = \partial v/\partial x + \partial v/\partial z$$

$$\theta_z = \partial w/\partial y + \partial w/\partial x$$

In order to derive element stiffness matrix, we use familiar piecewise approximation for each element.

For a line element:

$$u(x)=a_0+a_1x(1+x)$$

$$v(x)=b_0+b_1x(1+x)$$

$$w(x)=c_0+c_1x(1+x)$$

Hence, $$\theta_x=0$$

$$\theta_y=b_1(1+2x)$$

$$\theta_y=c_1(1+2x)$$

For a triangular shell element:

$$u(x)=a_0+a_1x+a_2y$$

$$v(x)=b_0+b_1x+b_2y$$

$$w(x)=c_0+c_1x+c_2y$$

$$\theta(x)=a_2$$

$$\theta(y)=b_1$$

$$\theta(z)=c_1+c_2$$

if the displacement approximation is changed as $$u(x)=a_0+a_1x(1+x)+a_2y(1+y)$$

$$v(x)=b_0+b_1x(1+x)+b_2y(1+y)$$

$$w(x)=c_0+c_1x(1+x)+c_2y(1+y)$$

$$\theta(x)=a_2(1+2x)$$

$\theta(y)=b_1(1+2x)$ $\theta(z)=c_1(1+2x)+c_2(1+2x)$

For quadrilateral element:

$u(x)=a_0+a_1x+a_2y+a_3xy$ $v(x)=b_0+b_1x+b_2y+b_3xy$ $w(x)=c_0+c_1x+c_2y+c_3xy$ $\theta(x)=a_2+a_3y$ $\theta(y)=b_1+b_3y$ $\theta(z)=c_1+c_2+c_3x+c_3y$ if displacement approximation is changed as $u(x)=a_0+a_1x(1+x)+a_2y(1+y)+a_3xy(x+y)$ $v(x)=b_0+b_1x(1+x)+b_2y(1+y)+b_3xy(x+y)$ $w(x)=c_0+c_1x(1+x)+c_2y(1+y)+c_3xy(x+y)$ $\theta(x)=a_2(1+2y)+a_3x^2+2a_3xy$ $\theta(y)=b_1(1+2x)+2b_3xy+b_3y^2$ $\theta(z)=c_1(1+2x)+c_2(1+2y)+4c_3xy+c_3y^2+c_3x^2$ For a solid tetrahedron element:

$u(x)=a_0+a_1x+a_2y+a_3z$ $v(x)=b_0+b_1x+b_2y+b_3z$ $w(x)=c_0+c_1x+c_2y+c_3z$ $\theta(x)=a_2+a_3$ $\theta(y)=b_2+b_3$ $\theta(z)=c_1+c_2$ if the displacement approximation is changed as $u(x)=a_0+a_1x(1+x)+a_2y(1+y)+a_3z(1+z)$ $v(x)=b_0+b_1x(1+x)+b_2y(1+y)+b_3z(1+z)$ $w(x)=c_0+c_1x(1+x)+c_2y(1+y)+c_3z(1+z)$ $\theta(x)=a_2(1+2y)+a_3(1+2z)$ $\theta(y)=b_1(1+2x)+b_3(1+2z)$ $\theta(z)=c_1(1+2x)+c_3(1+2z)$ For a solid cube element:

$u(x)=a_1+a_2x+a_3y+a_4z+a_5xy+a_6yz+a_7zx+a_8xyz$ $v(x)=b_1+b_2x+b_3y+b_4z+b_5xy+b_6yz+b_7zx+b_8xyz$ $w(x)=c_1+c_2x+c_3y+c_4z+c_5xy+c_6yz+c_7zx+c_8xyz$ $\theta(x)=a_3+a_5x+a_6z+a_8xz+a_4+a_6y+a_7x+a_8xy$ $\theta(y)=b_2+b_5y+b_7z+b_8xy+b_4+b_6y+b_7x+b_8xy$ $\theta(z)=c_2+c_5y+c_7z+c_8yz+c_3+c_5x+c_6z+c_8xz$ Similarly, displacement relations can be derived by those of skill in the art for different approximations.

Now, evaluate constants a0, a1 ..., an, b0, b1 ..., bn, and c0, c1 ..., cn, in terms of nodal DOF ui, vi, wi.

For example, consider a beam element:

$u(x)=a_0+a_1x(1+x)$ $v(x)=b_0+b_1x(1+x)$ $w(x)=c_0+c_1x(1+x)$

Noting that $u=u_0$ at $x=x_0$ and $u=u_1$ at $x=x_1$ $v=v_0$ at $x=x_0$ and $v=v_1$ at $x=x_1$ $w=w_0$ at $x=x_0$ and $w=w_1$ at $x=x_1$ and $a_0=u_0$ $b_0=v_0$ $c_0=w_0$ $$a_1 = \frac{u_1 - u_0}{l(1+l)}$$

$$b_1 = \frac{v_1 - v_0}{l(1+l)}$$

$$c_1 = \frac{w_1 - w_0}{l(1+l)}$$

where l is the length of the line element.

Hence $$\begin{Bmatrix} u(x) \\ v(x) \\ w(x) \\ \theta(x) \\ \theta(y) \\ \theta(z) \end{Bmatrix} =$$

$$\begin{bmatrix} 1-\frac{x(1+x)}{l(1+l)} & \frac{x(1+x)}{l(1+l)} & 0 & 0 & 0 & 0 \\ 0 & 0 & 1-\frac{x(1+x)}{l(1+l)} & \frac{x(1+x)}{l(1+l)} & 0 & 0 \\ 0 & 0 & 0 & 0 & 1-\frac{x(1+x)}{l(1+l)} & \frac{x(1+x)}{l(1+l)} \\ 0 & 0 & 0 & 0 & 0 & 0 \\ 0 & 0 & -\frac{1}{l(1+l)} & \frac{1}{l(1+l)} & 0 & 0 \\ 0 & 0 & 0 & 0 & -\frac{1}{l(1+l)} & \frac{1}{l(1+l)} \end{bmatrix} \begin{Bmatrix} u_0 \\ u_1 \\ v_0 \\ v_1 \\ w_0 \\ w_1 \end{Bmatrix}$$

Similarly, the displacement relations for all other types of finite elements can be obtained.

The above equations can be represented as:

$\{u\} = [N]\{d\}$ where [N] is referred as shape function matrix and is given as:

$$\begin{bmatrix} 1-\frac{x(1+x)}{l(1+l)} & \frac{x(1+x)}{l(1+l)} & 0 & 0 & 0 & 0 \\ 0 & 0 & 1-\frac{x(1+x)}{l(1+l)} & \frac{x(1+x)}{l(1+l)} & 0 & 0 \\ 0 & 0 & 0 & 0 & 1-\frac{x(1+x)}{l(1+l)} & \frac{x(1+x)}{l(1+l)} \\ 0 & 0 & 0 & 0 & 0 & 0 \\ 0 & 0 & -\frac{1}{l(1+l)} & \frac{1}{l(1+l)} & 0 & 0 \\ 0 & 0 & 0 & 0 & -\frac{1}{l(1+l)} & \frac{1}{l(1+l)} \end{bmatrix}$$

for beam elements.

Similarly shape function matrix for all other elements can be derived.

Now the strain displacement relations can be expressed in terms of shape function matrix as:

$\{\epsilon\} = [B]\{d\}$ where $[B] = [\partial][N]$

Force displacement relations are:

$[K]\{d\} = \{F\}$ where $[K] = \int [B]^T [E][B] dv$ where [K] is the element stiffness matrix that can be derived from [N]. [E] is the elasticity matrix that depends the material and geometric properties.

Hence the above equations result in a set of algebraic equations that can be solved using preconditioned conjugate gradient method and displacements at each node {ui} can be obtained. After obtaining {ui}, the rotation displacements can be determined from the strain displacement relations.

Those skilled in the art will recognize that, for simplicity and clarity, the full structure and operation of all data processing systems suitable for use with the present invention is not being depicted or described herein. Instead, only so much of a system and method as is unique to the present invention or necessary for an understanding of the present invention is depicted and described. The remainder of the construction and operation of the system and method may conform to any of the various current implementations and practices known in the art.

It is important to note that while the present invention has been described in the context of a fully functional system, those skilled in the art will appreciate that at least portions of the mechanism of the present invention are capable of being distributed in the form of a instructions contained within a machine usable medium in any of a variety of forms, and that the present invention applies equally regardless of the particular type of instruction or signal bearing medium utilized to actually carry out the distribution. Examples of machine usable mediums include: nonvolatile, hard-coded type mediums such as read only memories (ROMs) or erasable, electrically programmable read only memories (EEPROMs), user-recordable type mediums such as floppy disks, hard disk drives and compact disk read only memories (CD-ROMs) or digital versatile disks (DVDs), and transmission type mediums such as digital and analog communication links.

Although an exemplary embodiment of the present invention has been described in detail, those skilled in the art will understand that various changes, substitutions, variations, and improvements of the invention disclosed herein may be made without departing from the spirit and scope of the invention in its broadest form.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC §112 unless the exact words "means for" are followed by a participle.

What is claimed is:

1. A method for performing a finite element rotation transformation, comprising:
   discretizing a region of an object model into finite elements;
   determining an approximate rotational displacement solution for each finite element depending on the finite element type;
   determining an element stiffness matrix for each finite element and global stiffness;
   evaluating displacement and load column matrices for each element by substituting loads and boundary conditions; and
   solving a resulting system of equations to produce translation displacements at each node of each finite element.

2. The method of claim 1, further comprising converting the approximate rotational displacements to translations based on force displacement relations.

3. The method of claim 1, wherein determining global stiffness includes assembling all the element stiffness matrices.

4. The method of claim 1, wherein at least one finite element is a solid element.

5. The method of claim 1, wherein at least one finite element is a shell element.

6. The method of claim 1, wherein at least one finite element is a beam element.

7. The method of claim 1, wherein the element stiffness matrix for each element includes the effect of both translation and rotation loads.

8. A data processing system having at least a processor and accessible memory, comprising:
   means for discretizing a region of an object model into finite elements;
   means for determining an approximate rotational displacement solution for each finite element depending on the finite element type;
   means for determining an element stiffness matrix for each finite element and global stiffness;
   means for evaluating displacement and load column matrices for each element by substituting loads and boundary conditions; and
   means for solving a resulting system of equations to produce translation displacements at each node of each finite element.

9. The data processing system of claim 8, further comprising means for converting the approximate rotational displacements to translations based on force displacement relations.

10. The data processing system of claim 8, wherein determining global stiffness includes assembling all the element stiffness matrices.

11. The data processing system of claim 8, wherein at least one finite element is a solid element.

12. The data processing system of claim 8, wherein at least one finite element is a shell element.

13. The data processing system of claim 8, wherein at least one finite element is a beam element.

14. The data processing system of claim 8, wherein the element stiffness matrix for each element includes the effect of both translation and rotation loads.

15. A computer product tangibly embodied in a machine-readable medium, comprising:
   instructions for discretizing a region of an object model into finite elements;
   instructions for determining an approximate rotational displacement solution for each finite element depending on the finite element type;
   instructions for determining an element stiffness matrix for each finite element and global stiffness;
   instructions for evaluating displacement and load column matrices for each element by substituting loads and boundary conditions; and
   instructions for solving a resulting system of equations to produce translation displacements at each node of each finite element.

16. The computer program product of claim 15, further comprising instructions for converting the approximate rotational displacements to translations based on force displacement relations.

17. The computer program product of claim 15, wherein determining global stiffness includes assembling all the element stiffness matrices.

18. The computer program product of claim 15, wherein at least one finite element is a solid element.

19. The computer program product of claim 15, wherein at least one finite element is a shell element.

20. The computer program product of claim 15, wherein at least one finite element is a beam element.

21. The computer program product of claim 15, wherein the element stiffness matrix for each element includes the effect of both translation and rotation loads.

* * * * *